(12) United States Patent
Ge

(10) Patent No.: US 8,471,619 B2
(45) Date of Patent: *Jun. 25, 2013

(54) CIRCUIT AND METHOD FOR GENERATING A CLOCK SIGNAL

(75) Inventor: Henry Ge, Shenzhen (CN)

(73) Assignee: STMicroelectronics (Shenzhen) R&D Co. Ltd., Shenzhen (CN)

(*) Notice: Subject to any disclaimer, the term of this patent is extended or adjusted under 35 U.S.C. 154(b) by 0 days.

This patent is subject to a terminal disclaimer.

(21) Appl. No.: 13/556,136

(22) Filed: Jul. 23, 2012

(65) Prior Publication Data

US 2012/0286831 A1  Nov. 15, 2012

Related U.S. Application Data

(63) Continuation of application No. 12/975,129, filed on Dec. 21, 2010, now Pat. No. 8,237,482.

(51) Int. Cl.
*H03K 3/00* (2006.01)

(52) U.S. Cl.
USPC ............ 327/291; 327/154; 327/299; 327/512

(58) Field of Classification Search
USPC ................. 327/144–146, 154–155, 291–292, 327/298–299, 512–513; 331/10, 16, 44, 69
See application file for complete search history.

(56) References Cited

U.S. PATENT DOCUMENTS

| | | | |
|---|---|---|---|
| 6,888,413 B1 | 5/2005 | Adams et al. | |
| 7,064,617 B2* | 6/2006 | Hein et al. | 331/16 |
| 7,546,097 B2* | 6/2009 | Dunworth et al. | 455/124 |
| 7,982,551 B2 | 7/2011 | Iwaida et al. | |
| 8,237,482 B2* | 8/2012 | Ge | 327/291 |
| 2011/0156821 A1* | 6/2011 | Ge | 331/34 |

* cited by examiner

*Primary Examiner* — An Luu
(74) *Attorney, Agent, or Firm* — Seed IP Law Group PLLC

(57) ABSTRACT

A circuit comprises a frequency divider coupled to receive an oscillating signal generated by an oscillator and a division ratio and configured to divide the oscillating signal by the division ratio into a clock signal; a temperature compensation circuit configured to measure a temperature of the oscillator and generate a division ratio to be provided to the frequency divider and a first value on the basis of the measured temperature; and a control system configured to control connection between a calibration element and the oscillator based on the first value and the oscillating signal of the oscillator.

26 Claims, 12 Drawing Sheets

CIRCUIT AND METHOD FOR GENERATING A CLOCK SIGNAL

BACKGROUND

1. Technical Field

This disclosure relates generally to electronic circuits, and more particularly to a circuit and method for generating a clock signal, as well as a real time clock device comprising the circuit for generating a clock signal.

2. Description of the Related Art

A crystal oscillator is an electronic circuit that uses the mechanical resonance of a vibrating crystal of piezoelectric material to create an electrical signal with a very precise frequency. This frequency is commonly used to keep track of time (as in quartz wristwatches), to provide a stable clock signal for digital integrated circuits, and to stabilize frequencies for radio transmitters and receivers. The most common type of piezoelectric resonator is the quartz crystal, so oscillator circuits designed based on them are called "crystal oscillators".

Quartz oscillators provide an accuracy far superior to that of other conventional oscillator designs, but they are not perfect. Quartz crystals are sensitive to temperature variations, and may lead to degraded accuracy of the time information or clock signal in systems which, for example, may include a real time clock (RTC), a communication terminal and so on.

One approach that has been used to compensate for the time or signal error is adjusting the frequency at which the crystal oscillator oscillates by adding additional capacitive load across a crystal. Another approach that has been used is periodically modifying the frequency by deleting or inserting clock pulses. And an accuracy of better than 3-5 ppm can be obtained.

BRIEF SUMMARY

Some embodiments of the disclosure are a circuit and a method for generating a clock signal with higher accuracy in the case of temperature variations.

In a first embodiment, a circuit is disclosed. The circuit comprises a frequency divider coupled to receive an oscillating signal generated by an oscillator and a division ratio and configured to divide the oscillating signal by the division ratio into a clock signal; a temperature compensation circuit configured to measure a temperature of the oscillator and generate a division ratio to be provided to the frequency divider and a first value on the basis of the measured temperature; and a control system configured to control connection between a calibration element and the oscillator based on the first value and the oscillating signal of the oscillator.

In a second embodiment, a real time clock device is disclosed. The real time clock device comprises the circuit described in the first embodiment.

In a third embodiment, a method is disclosed. The method comprises: measuring a temperature of an oscillator; generating a division ratio and a first value on the basis of the temperature; dividing an oscillating signal generated by the oscillator by the division ratio into a clock signal; and controlling connection between a calibration element and the oscillator based on the first value and the oscillating signal of the oscillator.

The foregoing has outlined, rather broadly, features of the present disclosure. Additional features of the disclosure will be described, hereinafter, which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure.

BRIEF DESCRIPTION OF THE SEVERAL VIEWS OF THE DRAWINGS

For a more complete understanding of the present disclosure, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of embodiments of the present disclosure and are not necessarily drawn to scale. To more clearly illustrate certain embodiments, a letter indicating variations of the same structure, material, or process step may follow a figure number.

DETAILED DESCRIPTION

The making and using of embodiments are discussed in detail below. It should be appreciated, however, that the specific embodiments discussed are merely illustrative, and do not limit the scope of the disclosure.

Figure 1:
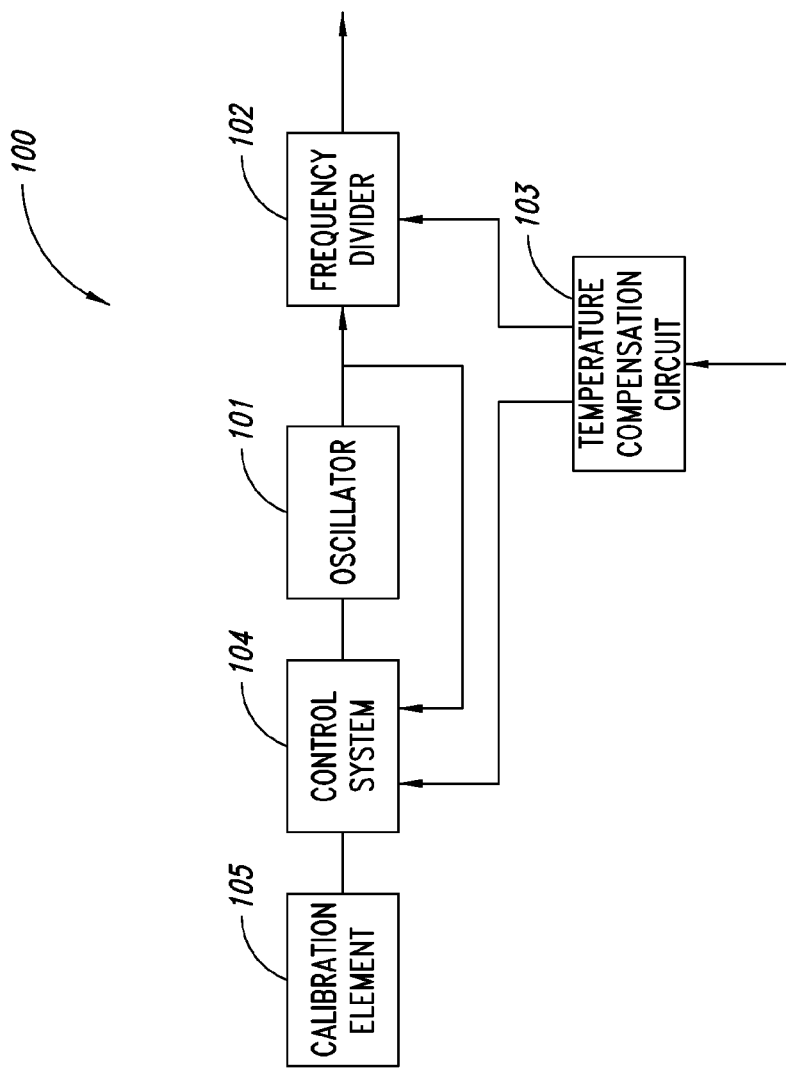
FIG. 1 illustrates a circuit for generating a clock signal according to one embodiment.

FIG. 1 illustrates a circuit 100 for generating a clock signal according to one embodiment. The circuit 100 comprises an oscillator 101, a frequency divider 102, a temperature compensation circuit 103, a control system 104 and a calibration element 105.

Figure 2:
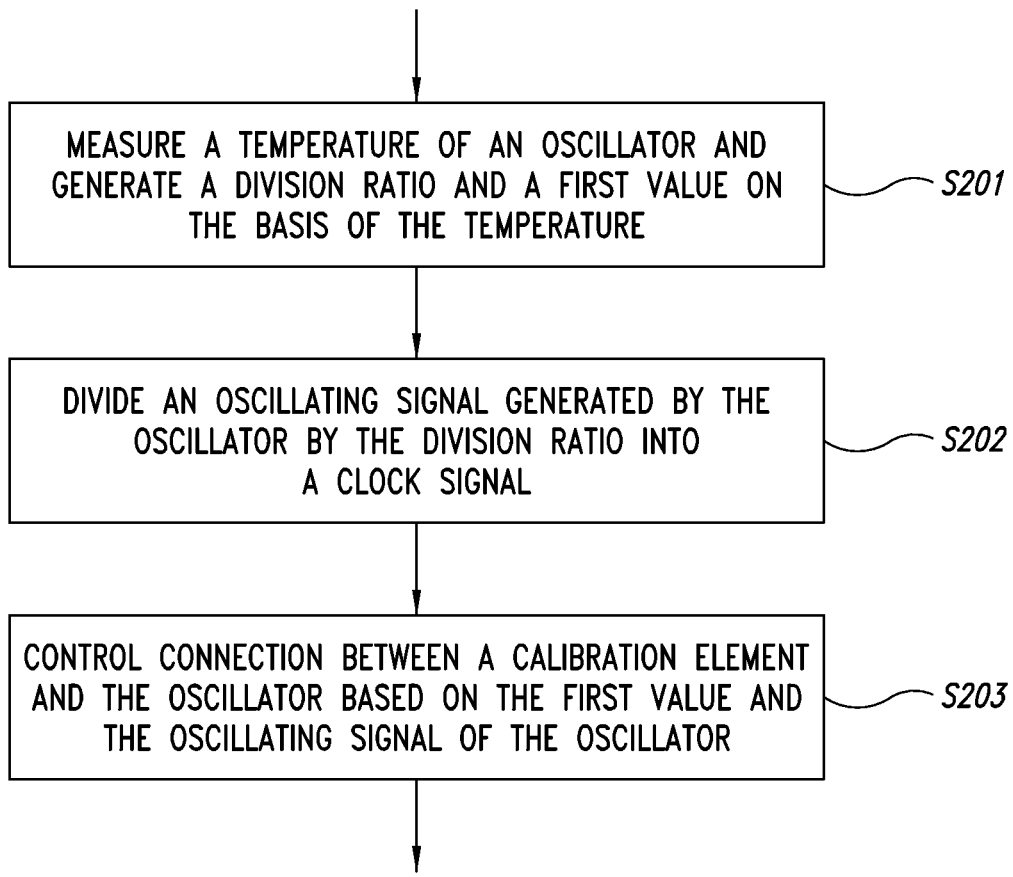
FIG. 2 illustrates a flow chart of generating a clock signal according to an embodiment.

Hereinafter, the operation of the circuit 100 will be elaborated by referring to the flow chart of generating a clock signal shown in FIG. 2.

In operation 5201, the temperature compensation circuit 103 receives a trigger signal and measures the temperature of the oscillator 101 in response to the trigger signal, for example at the rising edge or falling edge of the trigger signal, and then the temperature compensation circuit 103 generates the division ratio to be provided to the frequency divider 102 and the first value on the basis of the measured temperature.

In an embodiment, the trigger signal is the clock signal generated by the frequency divider 102. In alternative embodiments, the trigger signal can be a signal of any frequency.

In process S202, the frequency divider 102 receives the oscillating signal generated by the oscillator 101 and a division ratio provided by the temperature compensation circuit 103 and divides the oscillating signal by the division ratio into a clock signal.

In an embodiment, the oscillator 101 comprises one or a plurality of amplifiers and a feedback network to provide frequency selection. To be specific, in one embodiment, the feedback network can include mechanical resonators, for example, quartz crystals or ceramic resonators. Alternatively, phase shift circuits including resistors and capacitors can be used in the feedback network.

The resonant frequency of the oscillator 101 may be sensitive to the temperature variation. The resonant frequency of the oscillator 101 may change due to the temperature variation.

Figure 3:
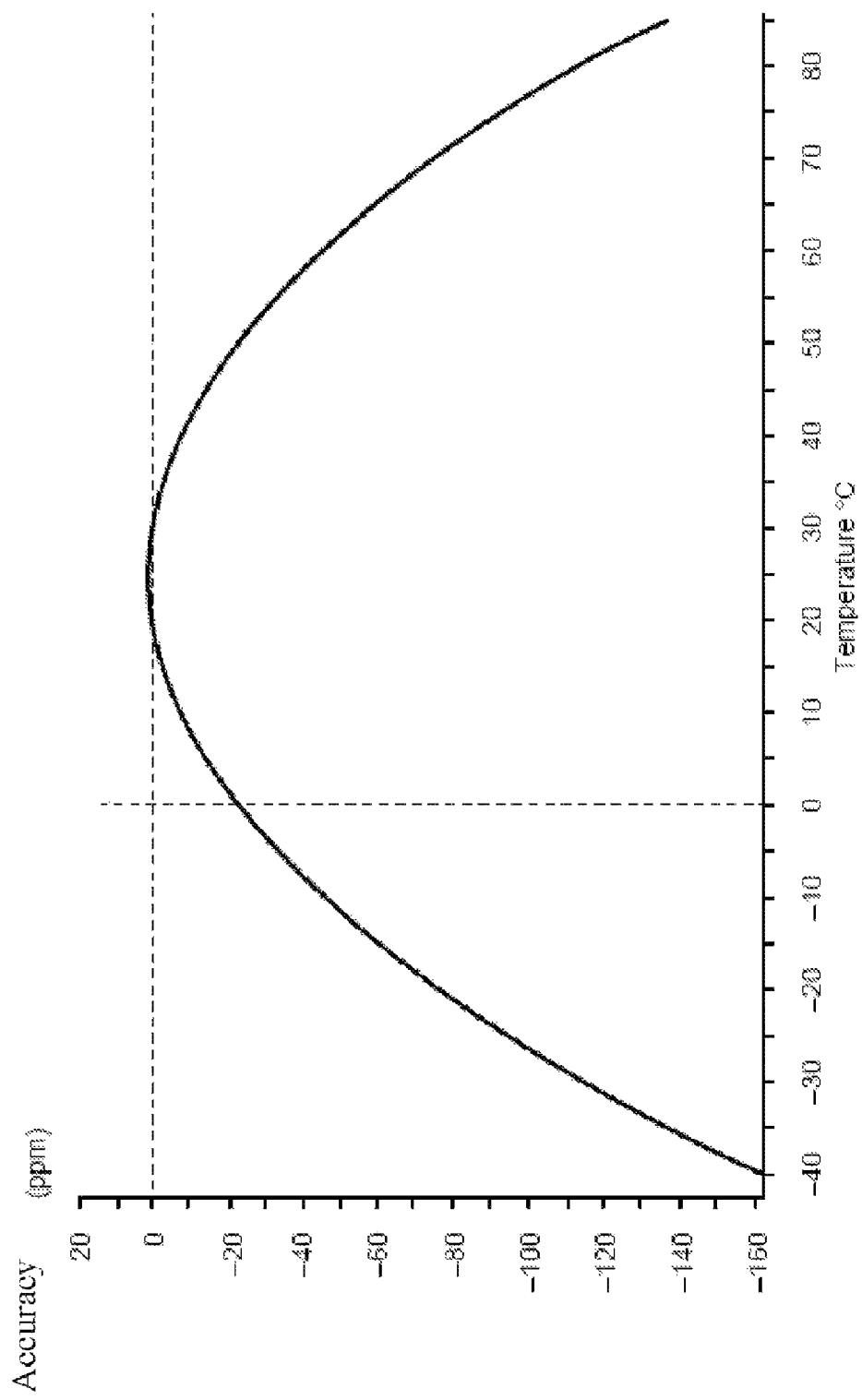
FIG. 3 illustrates the relationship between the temperature and the crystal accuracy of the oscillator.

FIG. 3 illustrates the relationship between the temperature and the crystal accuracy of the oscillator 101.

The relationship between the resonant frequency and the temperature follows the general formula given below:

$$f_1 = at^2 + bt + c$$

wherein $f_1$ denotes the resonant frequency of the oscillator 101, t denotes the temperature, and a, b and c are crystal-dependent coefficients. The value of a, b, c can be determined by measuring the resonant frequency of the oscillator 101 at three temperature points, for example −40° C., 25° C. and 85° C.

In one embodiment, the frequency divider 102 is a programmable divide-by-n counter comprising cascaded flip-flops. The frequency divider 102 can be programmed, for example, by storing a desired division ratio n in a register accessible to end users. The flip-flops toggle, i.e., change state, on each rising edge and/or falling edge of the input oscillating signal. Once the state corresponding to the division ratio n is detected, the frequency divider 102 outputs a pulse and the flip-flops are reset at the same time. In this way, the count value between reset pulses is n.

In process S203, the control system 104 controls the connection between the calibration element 105 and the oscillator 101 based on the first value and the oscillating signal of the oscillator 101.

Figure 4:
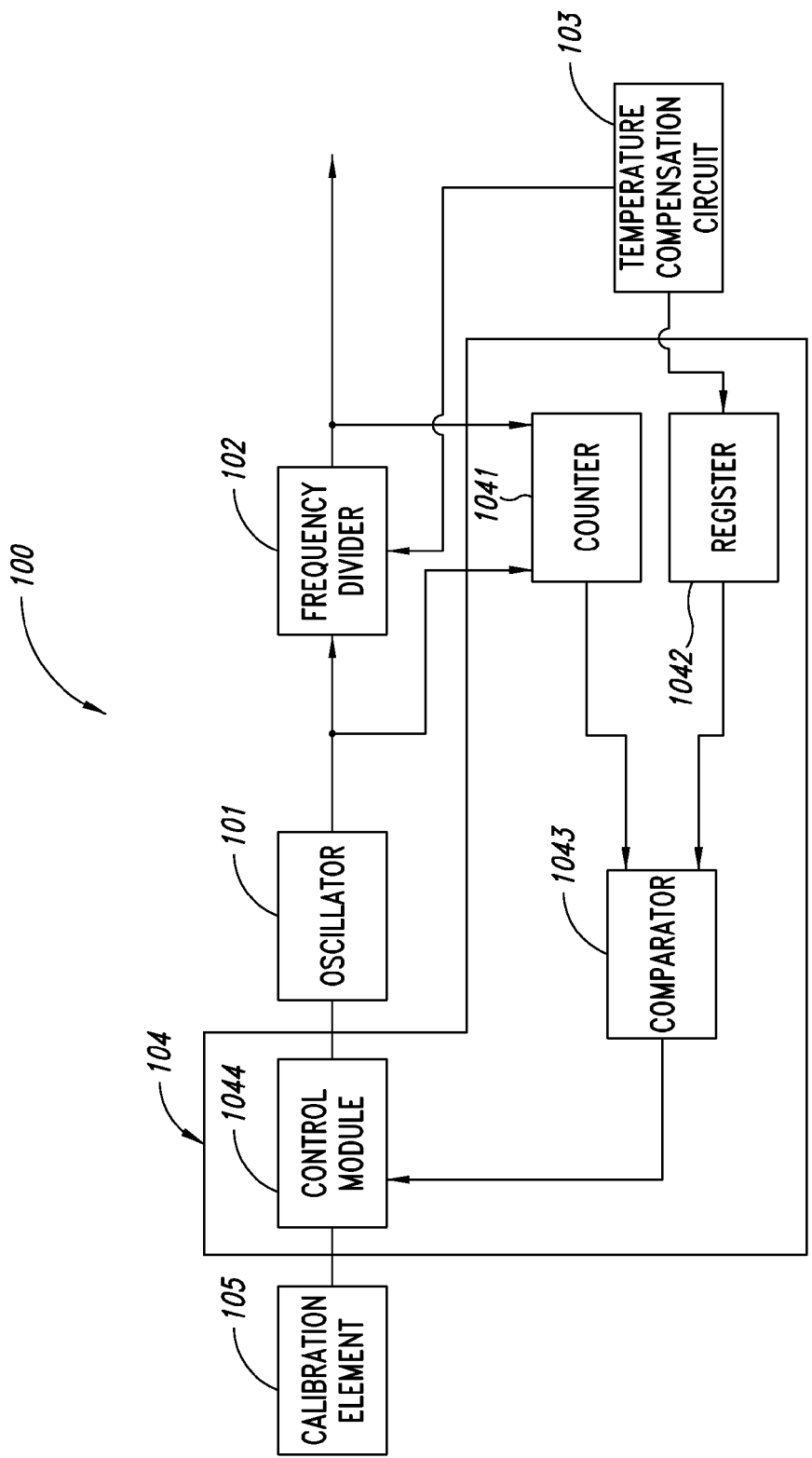
FIG. 4 illustrates an embodiment of the circuit of FIG. 1.

In an embodiment, as shown in FIG. 4, the control system 104 comprises a counter 1041, a register 1042, a comparator 1043 and a control module 1044.

Figure 5:
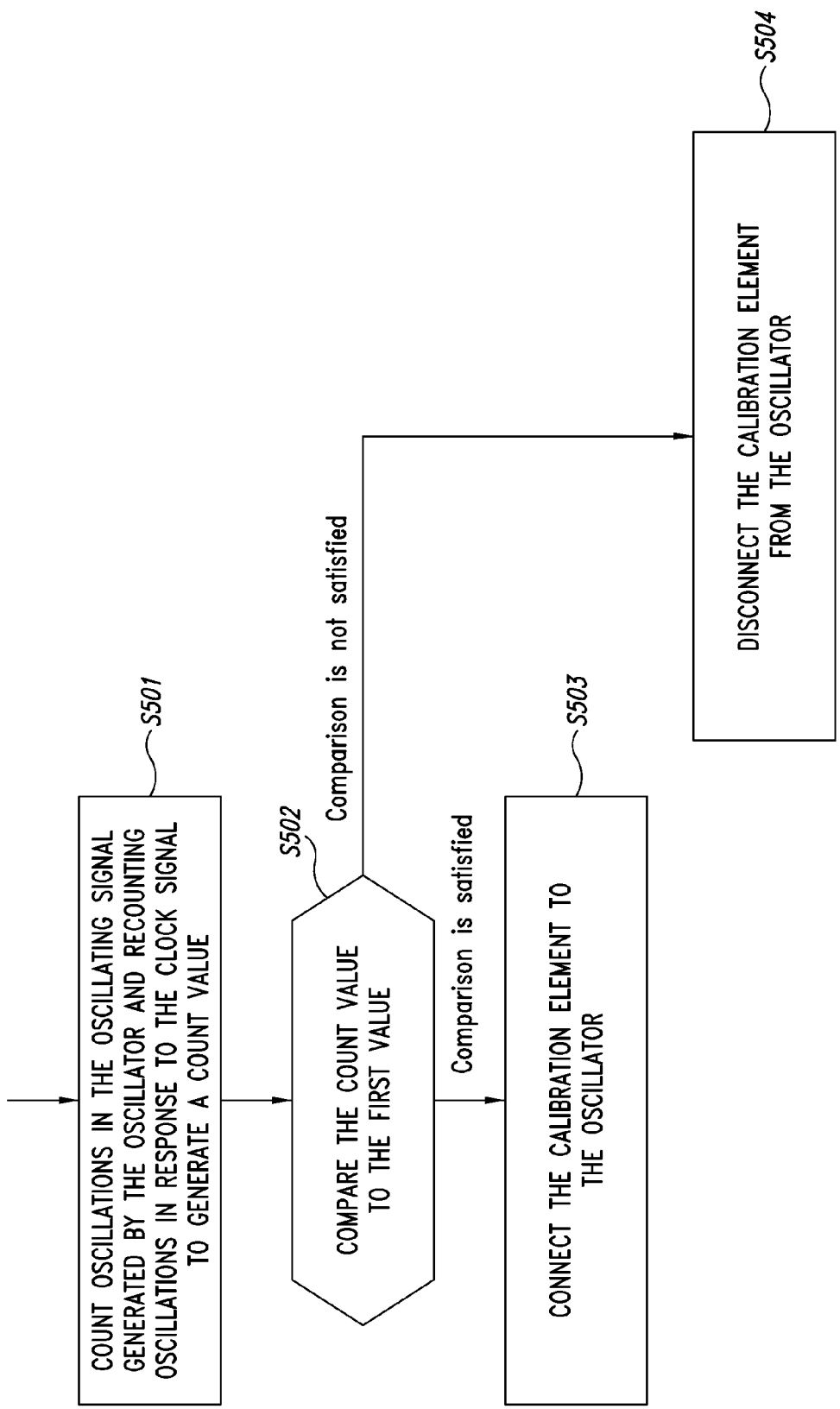
FIG. 5 illustrates an flow chart of the process of the control system illustrated in FIG. 4 according to an embodiment.

Hereinafter, the operation of the control system 104 will be elaborated by referring to the flow chart shown in FIG. 5.

The counter 1041 is coupled to the oscillator 101 and the frequency divider 102 to respectively receive the oscillating signal generated by the oscillator 101 and the clock signal generated by the frequency divider 102.

In process S501, the counter 1041 counts oscillations in the oscillating signal and is reset in response to the clock signal. In an embodiment, the counter 1041 counts oscillations in the oscillating signal and is reset to zero at the rising edge or the falling edge of the clock signal. The count value output from the counter 1041 is applied to a first, for example, positive input of the comparator 1043.

The register 1042 is programmable, which receives a first value from the temperature compensation circuit 103 and stores the first value. The first value is applied to a second, for example, negative input of the comparator 1043.

In process S502, the comparator 1043 compares the count value provided by the counter 1041 to the first value provided by the register 1042. The output of the comparator 1043 changes state based on the result of the comparison, for example, when the count value exceeds the first value. Generally, a comparator is implemented with logic gate circuits. For example, a simple 1-bit comparator can be implemented by two NOT gates and two AND gates, and a multi-bit comparator can be implemented by cascading a plurality of simple comparators. In an embodiment, the comparator 1043 is implemented by connecting four 4-bit comparators in cascade and high bits are compared first. If a comparison is obtained, there is no need to compare low bits further.

The control module 1044 is coupled to the comparator 1043 to receive the output from the comparator 1043. If the comparison is satisfied, then in process S503, the control module 1044 connects the calibration element 105 to the oscillator 101; if the comparison is not satisfied, then in process S504, the control module 1044 disconnects the calibration element 105 from the oscillator 101.

In one embodiment, when the count value is less than or equals to the first value, the output of the comparator 1043 keeps a constant state, for example, logic low or logic high, and the calibration element 105 is disconnected from the oscillator 101. Once the count value exceeds the first value, the output of the comparator 1043 changes state, for example, changes from logic low to logic high or from logic high to logic low, and thereby the control module 1044 connects the calibration element 105 to the oscillator 101. In an embodiment, the control module 1044 is an n-channel enhancement-mode MOSFET and the output of the comparator 1043 is applied on the gate of the MOSFET. When the output of the comparator 1043 is logic high, a conducting channel is formed between the source and the drain of the MOSFET and the calibration element 105 is connected to the oscillator 101. When the output of the comparator 1043 is logic low, the channel is cutoff and the calibration element 105 is disconnected from the oscillator 101. In alternative embodiments, a p-channel MOSFET, a bipolar junction transistor, or a diode can be used.

In one embodiment, the calibration element 105 is a capacitive load including, for example, a capacitor or a plurality of capacitors. In an alternative embodiment, the calibration element 105 is an inductive load including, for example, an inductor or a plurality of inductors.

When the calibration element 105 is the capacitive load that is an equivalent parallel capacitive load as seen from the nodes of the oscillator 101, the frequency of the oscillating signal generated by the oscillator 101 will be slowed down. When the calibration element 105 is the capacitive load that is an equivalent series capacitive load as seen from the nodes of the oscillator 101, the frequency of the oscillating signal generated by the oscillator 101 will be speeded up. The capacitance of the capacitive load is set so that $|f_1-f_2|>1$ Hz, for example, about 15 pF or 20 pF.

It will be appreciated that in another embodiment of the circuit 100, the oscillator 101 can be an external component and is not included in the circuit 100.

Figure 6:
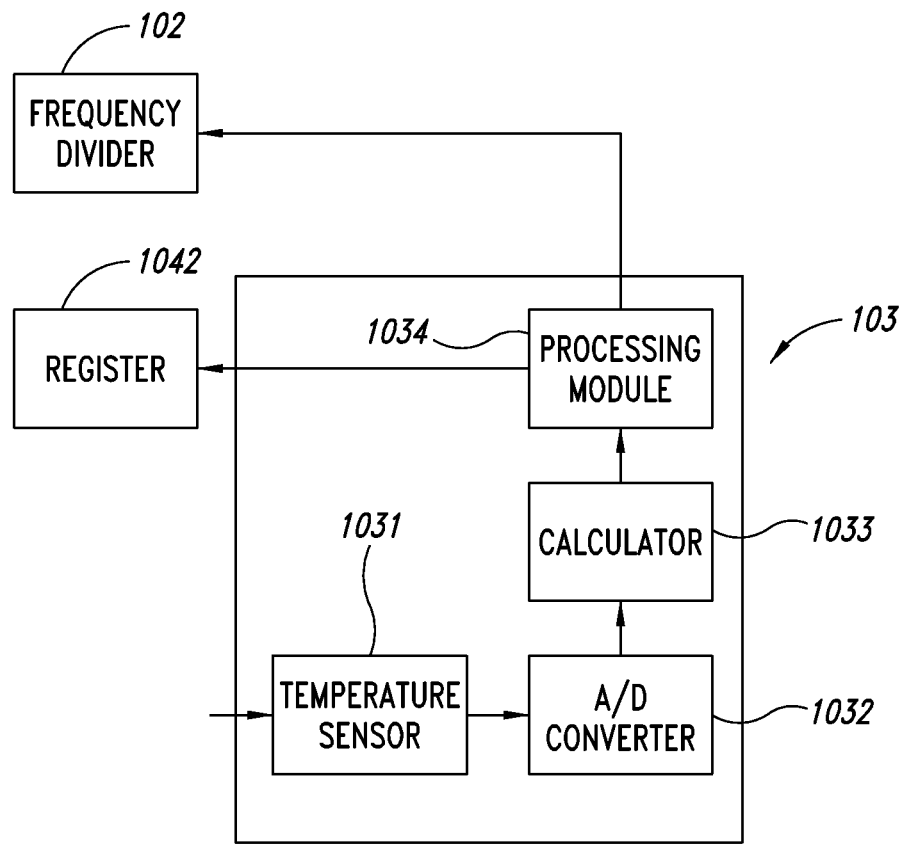
FIG. 6 illustrates a temperature compensation circuit according to one embodiment.

FIG. 6 illustrates a temperature compensation circuit according to an embodiment.

As shown in FIG. 6, the temperature compensation circuit 103 comprises a temperature sensor 1031, an A/D converter 1032, a calculator 1033 and a processing module 1034.

Figure 7:
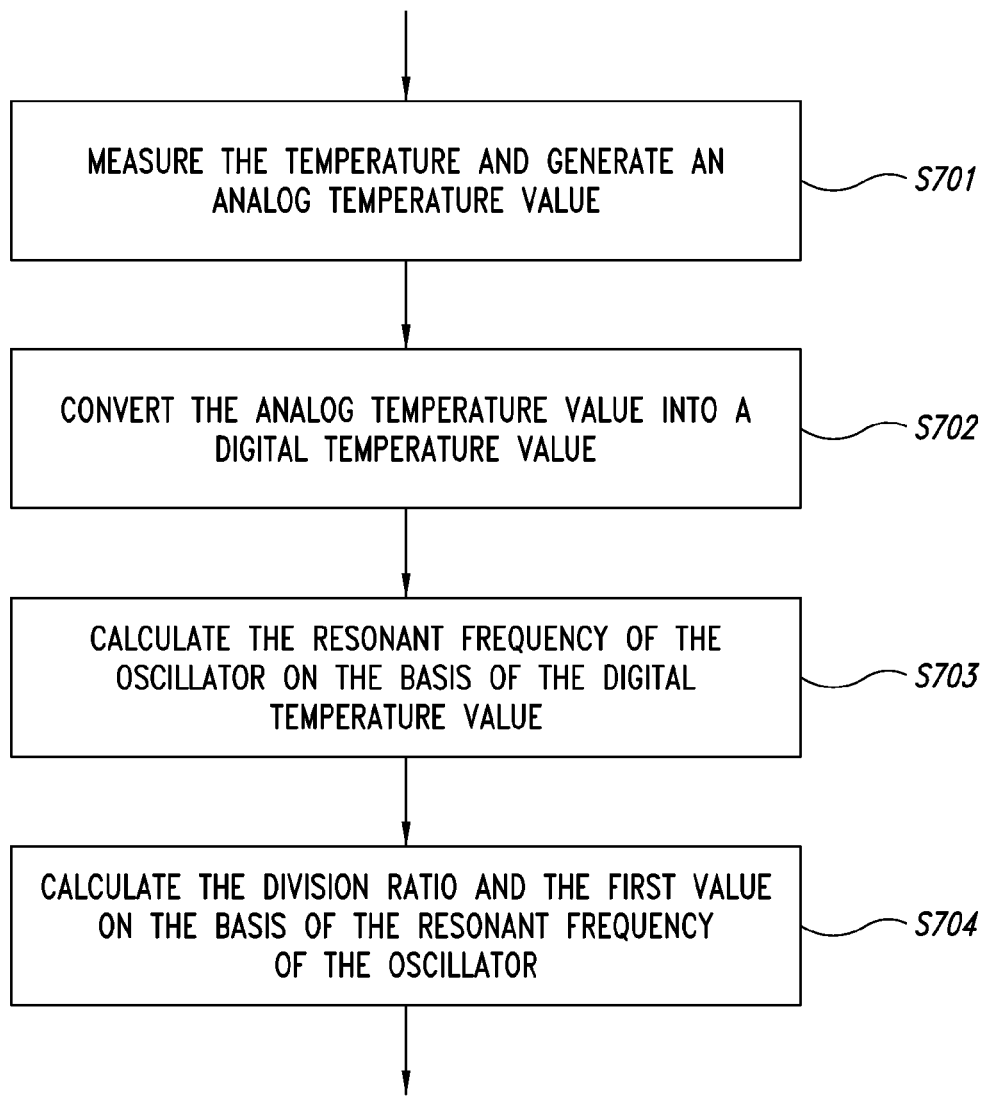
FIG. 7 illustrates a flow chart of the process of the temperature compensation circuit illustrated in FIG. 6 according to an embodiment.

Hereinafter, the operation of the temperature compensation circuit 103 of FIG. 6 will be elaborated by referring to the flow chart shown in FIG. 7.

In process S701, the temperature sensor 1031 measures the temperature of the oscillator 101 in response to a trigger signal, for example at the rising edge or falling edge of the trigger signal, and generates an analog temperature value.

In an embodiment, the trigger signal provided to the temperature sensor 1031 is the clock signal generated by the frequency divider 102 with a frequency of 1 Hz. If so, the temperature sensor 1031 measures the temperature every 1 second. In alternative embodiments, the trigger signal can be a signal with a frequency of, for example 1/60 Hz or 1/3600 Hz. If so, the temperature sensor 1031 measures the temperature, for example every 1 minute or every 1 hour.

In process S702, the A/D converter 1032 is coupled to the temperature sensor 1031 to receive the analog temperature value and converts the analog temperature value into a digital temperature value. In an embodiment, the A/D converter 1032 preferably has a resolution of 16 bits, i.e., the A/D converter 1032 can produce $2^{16}$ quantization levels over the range of the input analog temperature value. The resolution of the A/D converter 1032 can be set according to practical demands. In an alternative embodiment, the A/D converter 1032 has a resolution of 8 bits.

In process S703, the calculator 1033 is coupled to the A/D converter 1032 to receive the digital temperature value and calculates the resonant frequency of the oscillator 101 on the basis of the digital temperature value. To be specific, in an embodiment, the calculator 1033 first calculates the temperature using approximately the following equation:

$$T=sk+l \quad \text{(Eq. 1)}$$

wherein T denotes the temperature, s and l are device-dependent coefficients, for example the temperature sensor 1031 relevant coefficients, which may be prestored in the calculator 1033, and k denotes the digital temperature value received from the A/D converter 1032.

Then the calculator 1033 calculates the resonant frequency of the oscillator 101 at the present temperature on the basis of the calculated temperature T using approximately the following equation:

$$f_1=aT^2+bT+c \quad \text{(Eq. 2)}$$

wherein $f_1$ denotes the resonant frequency of the oscillator 101 and a, b, c are crystal-dependent coefficients which may be prestored in the calculator 1033.

In one embodiment, the calculator 1033 is a hardware calculator, for example, realized by multiplier circuits and adder circuits. Alternatively, the function performed by the calculator 1033 can be realized by software.

In process S704, the processing module 1034 is coupled to the calculator 1033 to receive the resonant frequency of the oscillator 101. With the resonant frequency of the oscillator 101, the processing module 1034 first takes the integer part of the resonant frequency of the oscillator 101 or the integer part of the resonant frequency of the oscillator 101 plus 1 as the division ratio and calculates the first value using approximately the following equation:

$$m \approx \frac{f_1(n-f_2)}{f_1-f_2} \quad \text{(Eq. 3)}$$

wherein m denotes the first value which is an integer closest to $$\frac{f_1(n-f_2)}{f_1-f_2},$$

$f_1$ denotes the resonant frequency of the oscillator 101, that is, the frequency of the oscillating signal when the calibration element 105 is disconnected from the oscillator 101, $f_2$ denotes the frequency of the oscillating signal when the calibration element 105 is connected to the oscillator 101, and n denotes the division ratio.

Then the processing module 1034 respectively provides the first value m to the register 1042 and the division ratio n to the frequency divider 102.

It is to be noted that the division ratio provided to the frequency divider 102 depends on the configuration between the calibration element 105 and the oscillator 101. For illustrative purposes only, the capacitive load is used as an illustrative example of the calibration element 105. If the capacitive load is an equivalent parallel capacitive load as seen from the nodes of the oscillator 101, the integer part of the resonant frequency of the oscillator 101 is taken as the division ratio to be provided to the frequency divider 102, and if the capacitive load is an equivalent series capacitive load as seen from the nodes of the oscillator 101, the integer part of the resonant frequency of the oscillator 101 plus 1 is taken as the division ratio to be provided to the frequency divider 102.

Figure 8:
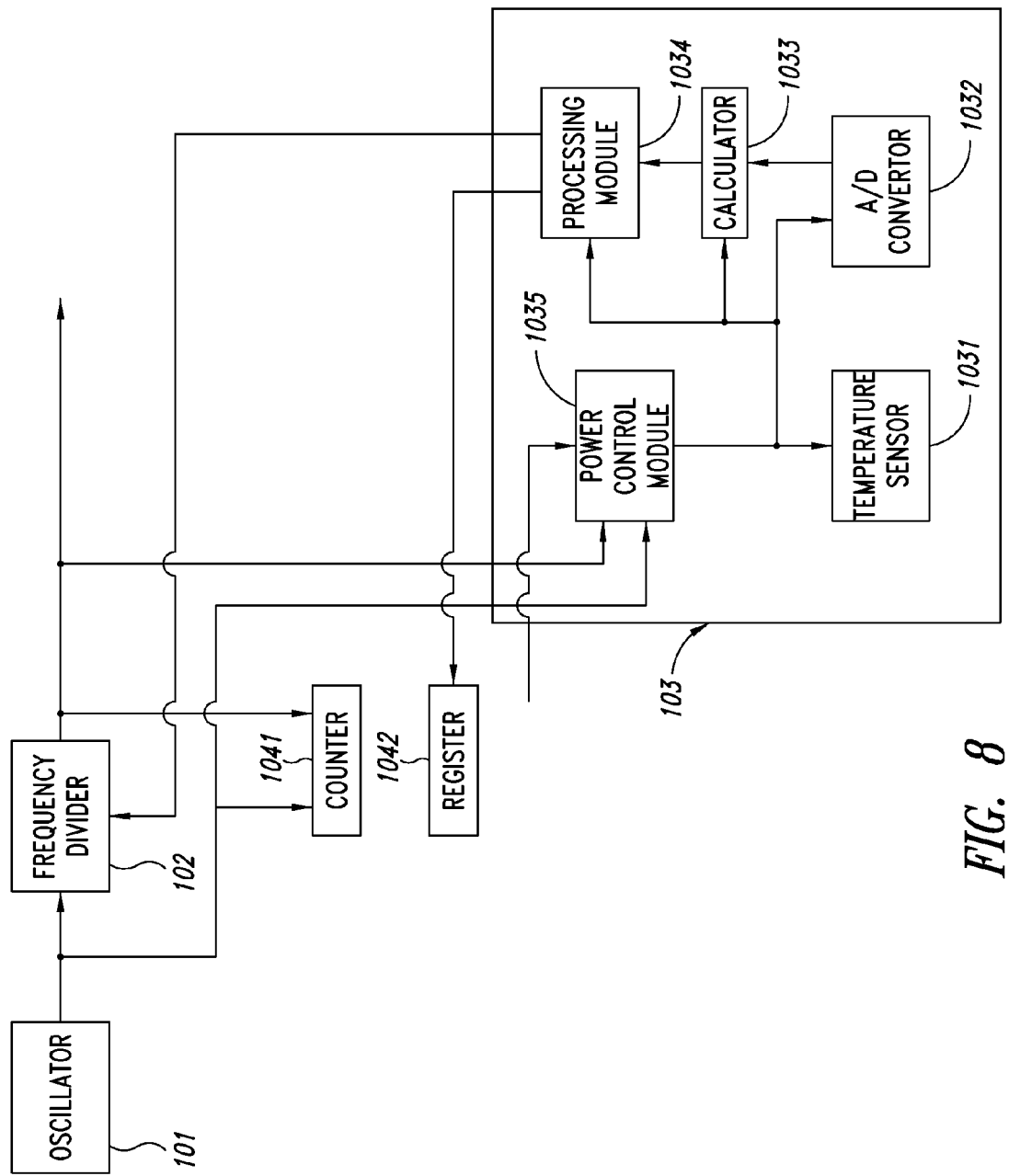
FIG. 8 illustrates a variation of the temperature compensation circuit shown in FIG. 6.

Optionally, as shown in FIG. 8, the temperature compensation circuit 103 further comprises a power control module 1035. The power control module 1035 is coupled to the frequency divider 102 and the oscillator 101 to respectively receive the clock signal and the oscillating signal and connects a power supply (not shown in FIG. 8) to the temperature sensor 1031, the A/D converter 1032, the calculator 1033 and the processing module 1034 in response to the clock signal and disconnects the power supply from the temperature sensor 1031, the A/D converter 1032, the calculator 1033 and the processing module 1034 in response to the oscillating signal. Once the power supply is connected to the temperature sensor 1031, the A/D converter 1032, the calculator 1033 and the processing module 1034, the temperature sensor 1031 starts to measure the temperature and generate an analog temperature value, and provide the analog temperature value to the A/D converter 1032. Then the A/D converter 1032 converts the analog temperature value into a digital temperature value and provide the digital temperature value to the calculator 1033, the calculator 1033 calculates the resonant frequency of the oscillator 101 on the basis of the digital temperature value and provides the resonant frequency of the oscillator 101 to the processing module 1034, and the processing module 1034 calculates the division ratio and the first value on the basis of the resonant frequency of the oscillator 101.

In an embodiment, the power control module 1035 connects the power supply to the temperature sensor 1031 and the A/D converter 1032, the calculator 1033 and the processing module 1034 at the rising edge or falling edge of the clock signal and disconnects the power supply from the temperature sensor 1031, the A/D converter 1032, the calculator 1033 and the processing module 1034 after 5 cycles of the oscillating signal.

It will be appreciated that the number of the cycles of the oscillating signal after which the power supply is disconnected from the temperature sensor 1031, the A/D converter 1032, the calculator 1033 and the processing module 1034 can be of any value as long as all the modules included in the temperature compensation circuit 103 can finish the operation during these cycles.

It shall be appreciated that the power supply also provides power to other modules included in the circuit 100 shown in FIG. 4.

Optionally, the temperature compensation circuit 103 shown in FIG. 8 further comprises a voltage regulator. The voltage regulator is coupled to the power supply to provide a stable voltage to the temperature sensor 1031, the A/D converter 1032, the calculator 1033 and the processing module 1034. In an embodiment, the voltage regulator is a low dropout regulator (LDO).

The power consumption of the circuit 100 comprising the power control module 1035 can be calculated through the formula $P_c = \text{Fixed} + r \cdot i/f_1$, wherein $P_c$ denotes the power consumption of the circuit 100, the 'Fixed' denotes the power consumption of the modules included in the circuit 100 except for the temperature compensation circuit 103, i denotes the current output from the power supply, $f_1$ denotes the resonant frequency of the oscillator 101, r denotes the number of the cycles of the oscillating signal after which the power supply is disconnected from the temperature sensor 1031, the A/D converter 1032, the calculator 1033 and the processing module 1034.

Figure 9:
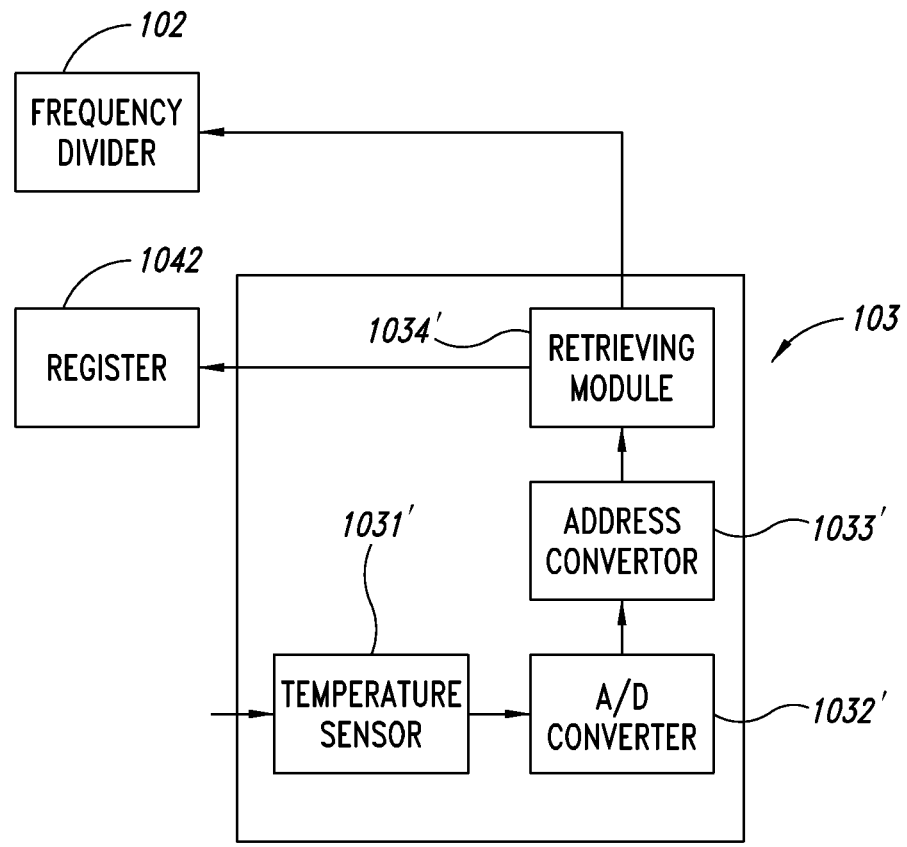
FIG. 9 illustrates a temperature compensation circuit according to another embodiment.

FIG. 9 illustrates a temperature compensation circuit according to another embodiment.

As shown in FIG. 9, the temperature compensation circuit 103 comprises a temperature sensor 1031', an A/D converter 1032', an address converter 1033' and a retrieving module 1034'.

Figure 10:
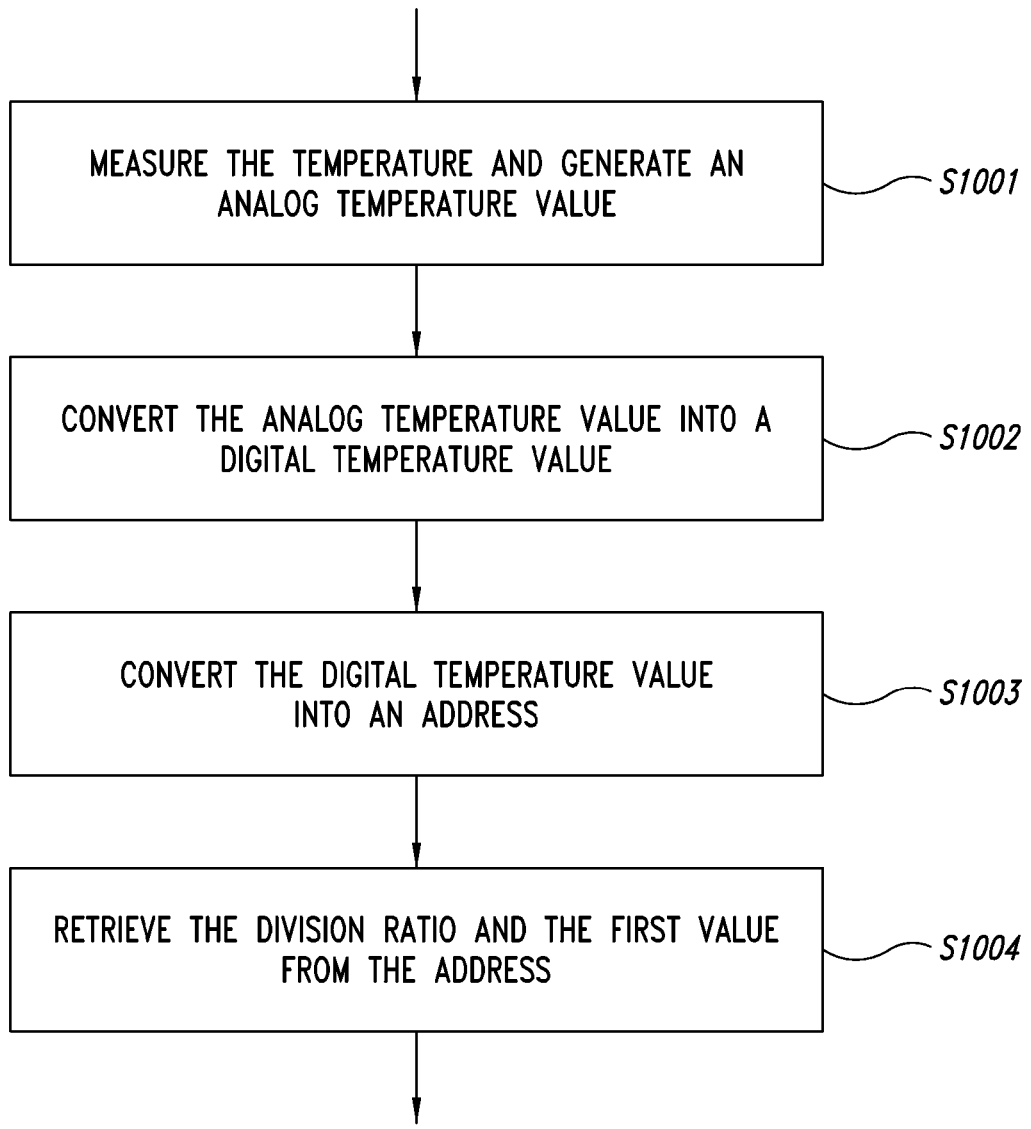
FIG. 10 illustrates a flow chart of the process of the temperature compensation circuit illustrated in FIG. 9 according to an embodiment.

Hereinafter, the operation of the temperature compensation circuit 103 of FIG. 9 will be elaborated by referring to the flow chart shown in FIG. 10.

In process S1001, the temperature sensor 1031' measures the temperature of the oscillator 101 in response to the trigger signal, for example at the rising edge or falling edge of the trigger signal, and generates an analog temperature value.

In an embodiment, the trigger signal provided to the temperature sensor 1031' is the clock signal generated by the frequency divider 102 with a frequency of 1 Hz.

If so, the temperature sensor 1031' measures the temperature every 1 second. In alternative embodiments, the trigger signal can be a signal with a frequency of, for example 1/60 Hz or 1/3600 Hz. If so, the temperature sensor 1031' measures the temperature, for example every 1 minute or every 1 hour.

In process S1002, the A/D converter 1032' is coupled to the temperature sensor 1031' to receive the analog temperature value and converts the analog temperature value into a digital temperature value. In an embodiment, the A/D converter 1032' preferably has a resolution of 16-bits.

In process S1003, the address converter 1033' is coupled to the A/D converter 1032' to receive the digital temperature value and converts the digital temperature value into an address. In an embodiment, −40° C. to 85° C. is separated into 1024 sectors respectively corresponding to 1024 addresses for temperature compensation, that is, for every 1° C., there are about 8 temperature compensation points. Each temperature compensation point corresponds to one address.

The retrieving module 1034' comprises a memory which stores a plurality of division ratios and a plurality of first values. In process S1004, the retrieving module 1034' is coupled to the address converter 1032' to receive the address which identifies a location in the memory. With the address, the retrieving module 1034' retrieves the division ratio and the first value from the address in the memory and respectively provides the division ratio and the first value to the frequency divider 102 and the register 1042. At every address, there stores one division ratio and one first value in the memory of the retrieving module 1034'.

At every temperature compensation point, the frequency of the oscillating signal when the calibration element 105 is disconnected from the oscillator 101 and the frequency of the oscillating signal when the calibration element 105 is connected to the oscillator 101 are measured. In one embodiment, by applying liquid nitrogen to the circuit 100 and then heating it at a controlled temperature-rising speed, a temperature range, for example from −40° C. to 85° C., can be obtained and the frequency of the oscillating signal when the calibration element 105 is disconnected from the oscillator 101 and the frequency of the oscillating signal when the calibration element 105 is connected to the oscillator 101 are measured on site during temperature changes.

The integer part of the resonant frequency of the oscillator 101 or the integer part of the resonant frequency of the oscillator 101 plus 1 is taken as the division ratio and the first value is calculated using approximately the following equation:

$$m \approx \frac{f_1(n - f_2)}{f_1 - f_2} \quad \text{(Eq. 4)}$$

wherein m denotes the first value which is an integer closest to $$\frac{f_1(n - f_2)}{f_1 - f_2},$$

$f_1$ denotes the frequency of the oscillating signal when the calibration element 105 is disconnected from the oscillator 101, $f_2$ denotes the frequency of the oscillating signal when the calibration element 105 is connected to the oscillator 101, and n denotes the division ratio.

Then, the first value m and the division ratio n corresponding to every temperature point are stored in the memory of the retrieving module 1034'.

It is to be noted that the division ratios stored in the memory of the retrieving module 1034' depends on the configuration between the calibration element 105 and the oscillator 101. For illustrative purposes only, the capacitive load is used as an illustrative example of the calibration element 105. If the capacitive load is an equivalent parallel capacitive load, the integer part of the resonant frequency of the oscillator 101 is taken as the division ratio to be stored in the memory of the retrieving module 1034', and if the capacitive load is an equivalent series capacitive load, the integer part of the resonant frequency of the oscillator 101 plus 1 is taken as the division ratio to be stored in the memory of the retrieving module 1034'.

Figure 11:
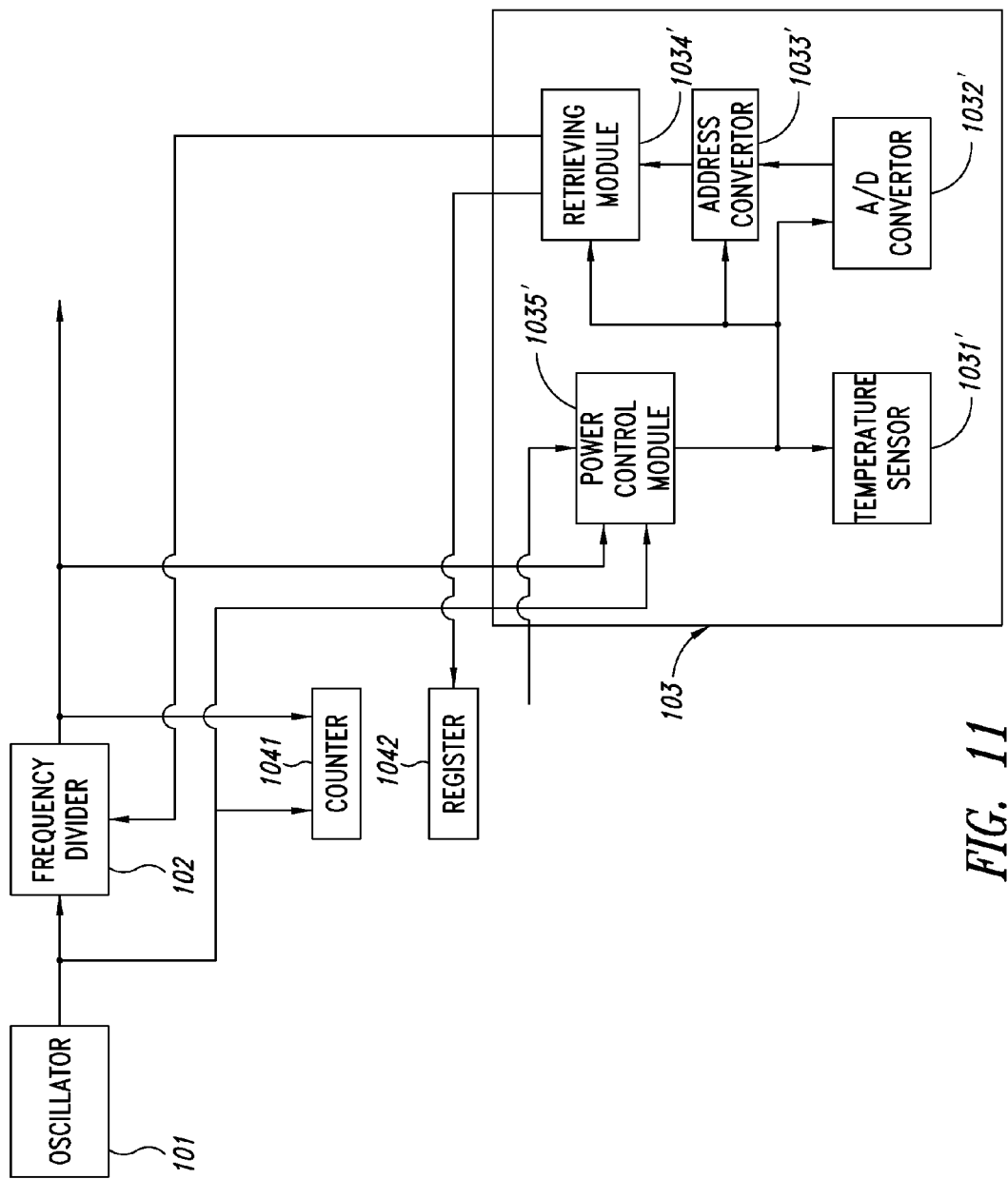
FIG. 11 illustrates a variation of the temperature compensation circuit shown in FIG. 9.

Optionally, as shown in FIG. 11, the temperature compensation circuit 103 further comprises a power control module 1035'. The power control module 1035' is coupled to the frequency divider 102 and the oscillator 101 to receive the clock signal and the oscillating signal and connects a power supply (not shown in FIG. 11) to the temperature sensor 1031', the A/D converter 1032', the address converter 1033' and the retrieving module 1034' in response to the clock signal and disconnects the power supply from the temperature sensor 1031', the A/D converter 1032', the address converter 1033' and the retrieving module 1034' in response to the oscillating signal. Once the power supply is connected, the temperature sensor 1031' starts to measure the temperature and generate an analog temperature value, and provide the analog temperature value to the A/D converter 1032'. Then the A/D converter 1032' converts the analog temperature value into a digital temperature value and provide the digital temperature value to the address converter 1033', the address converter 1033' converts the digital temperature value into an address and provide the address to the retrieving module 1034', and the retrieving module 1034' retrieves the division ratio and the first value from the address.

In an embodiment, the power control module 1035' connects the power supply to the temperature sensor 1031', the A/D converter 1032', the address converter 1033' and the retrieving module 1034' at the rising edge or falling edge of the clock signal and disconnects the power supply from the temperature sensor 1031', the A/D converter 1032', the address converter 1033' and the retrieving module 1034' after 5 cycles of the oscillating signal.

It will be appreciated that the number of the cycles of the oscillating signal after which the power supply 1035' is disconnected can be of any value as long as all the modules included in the temperature compensation circuit 103 can finish the operation during these cycles.

Optionally, the temperature compensation circuit 103 shown in FIG. 11 further comprises a voltage regulator. The voltage regulator is coupled to the power supply to provide a stable voltage to the temperature sensor 1031', the A/D converter 1032', the address converter 1033' and the retrieving module 1034'. In an embodiment, the voltage regulator is a low dropout regulator (LDO).

The power consumption of the circuit 100 comprising the power control module 1035' can be calculated through the formula $P_c=\text{Fixed}+r*i/f_1$, wherein $P_c$ denotes the power consumption of the circuit 100, the 'Fixed' denotes the power consumption of the modules included in the circuit 100 except for the temperature compensation circuit 103, i denotes the current output from the power supply, $f_1$ denotes the resonant frequency of the oscillator 101, r denotes the number of the cycles of the oscillating signal after which the power supply is disconnected from the temperature sensor 1031', the A/D converter 1032', the address converter 1033' and the retrieving 1034'.

In one embodiment, the circuit 100 shown in FIG. 1 and FIG. 4 is used in a real time clock device. Alternatively, the circuit 100 can also be used in, for example, a timer and signal synchronization applications.

Figure 12:
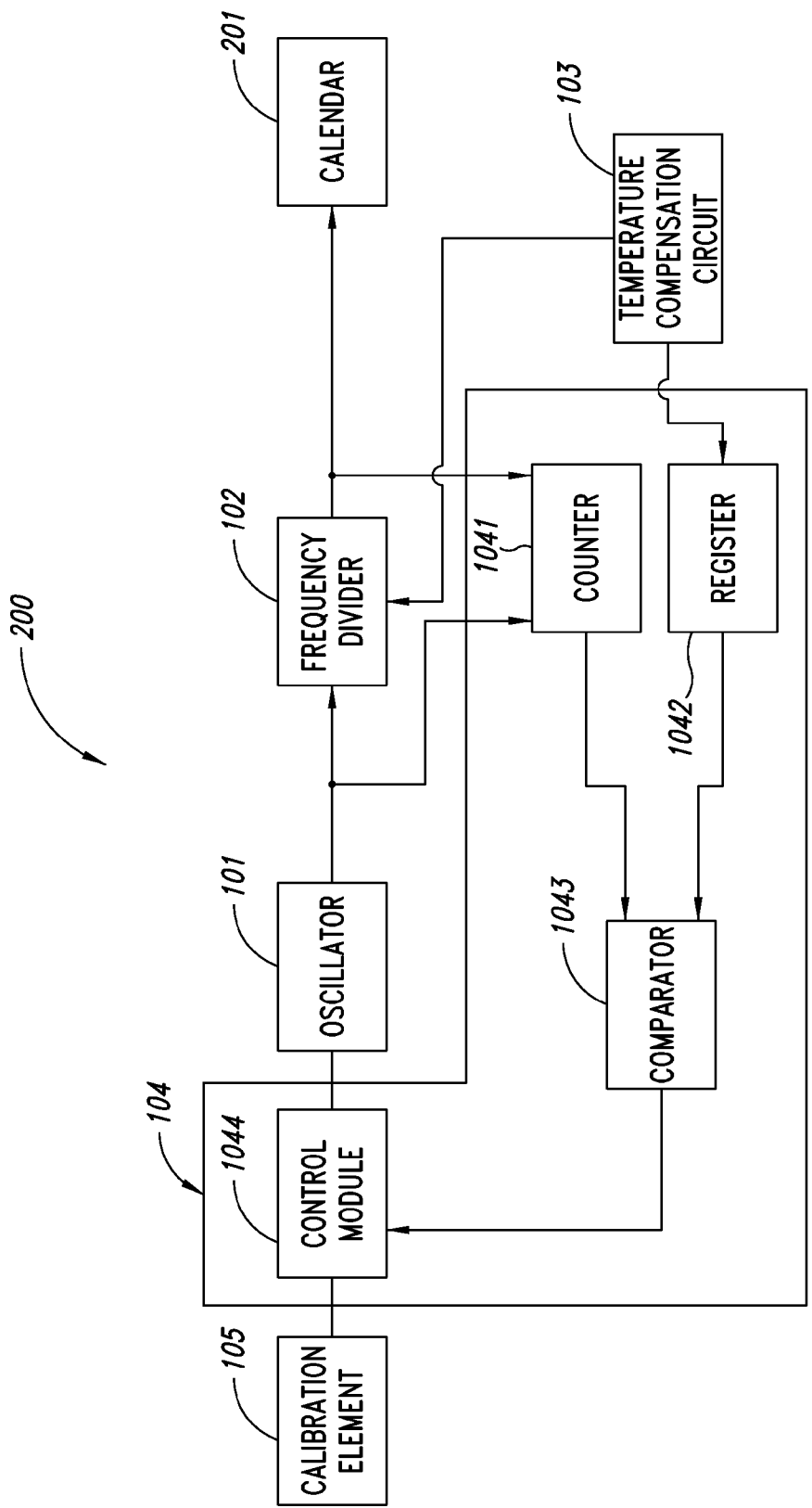
FIG. 12 illustrates a real time clock device according to one embodiment that comprises the circuit shown in FIG. 4.

FIG. 12 illustrates a real time clock device according to an embodiment that comprises the circuit 100 shown in FIG. 4.

In FIG. 12, the real clock time 200 further comprises a calendar 201 coupled to the frequency divider 102 to receive the clock signal generated by the frequency divider 102. The calendar 201 updates its count in response to the clock signal, for example at the rising edge or the falling edge of the clock signal and display time.

In the disclosure herein, operations of circuit embodiment(s) may be described with reference to method embodiment(s) for illustrative purposes. However, it should be appreciated that the operations of the circuits and the implementations of the methods in the disclosure may be independent of one another. That is, the disclosed circuit embodiments may operate according to other methods and the disclosed method embodiments may be implemented through other circuits.

It will also be readily understood by those skilled in the art that materials and methods may be varied while remaining within the scope of the present disclosure. It is also appreciated that the present disclosure provides many applicable inventive concepts other than the specific contexts used to illustrate embodiments. Accordingly, the appended claims are intended to include within their scope such processes, machines, manufacture, compositions of matter, means, methods, or steps.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A circuit, comprising:
   an oscillator configured to generate an oscillating signal;
   a capacitive calibration element coupled to the oscillator;
   a temperature compensation circuit configured to measure a temperature of the oscillator and to generate a threshold value; and
   a control system coupled to the temperature compensation circuit and configured to receive the threshold value and to connect or disconnect the capacitive calibration element from the oscillator based in part on the threshold value.

2. The circuit of claim 1, wherein the control system includes:
   a counter configured to receive the oscillating signal and the clock signal, to count oscillations in the oscillating signal, and to be reset in response to the clock signal;
   a register configured to receive the threshold value from the temperature compensation circuit and provide the threshold value;
   a comparator configured to compare the oscillations count to the threshold value; and
   a control module coupled to an output of the comparator and configured to connect the calibration element to the oscillator based on the output, and isolate the calibration element from the oscillator based on the output.

3. The circuit of claim 1, wherein the temperature compensation circuit includes:
   a temperature sensor configured to measure the temperature of the oscillator and generate an analog temperature value;
   an A/D converter coupled to the temperature sensor to receive the analog temperature value and configured to convert the analog temperature value into a digital temperature value;
   a calculator coupled to the A/D converter to receive the digital temperature value and configured to calculate a resonant frequency of the oscillator based on the digital temperature value;
   a frequency divider coupled the oscillator and configured to receive the oscillating signal and to divide the oscillating signal by a division ratio into a clock signal; and
   a processing module coupled to the calculator to receive the resonant frequency of the oscillator and configured to calculate the division ratio to be provided to the frequency divider and the threshold value based on the resonant frequency of the oscillator.

4. The circuit of claim 3, wherein the calculator is configured to calculate the temperature of the oscillator using the following equation:

$$T=sk+l,$$

wherein T denotes the temperature of the oscillator, s and l are coefficients relevant to the temperature sensor, and k denotes the digital temperature value, and the calculator is configured to calculate the resonant frequency of the oscillator using the following equation:

$$f_1 = aT^2 + bT + c$$

wherein $f_1$ denotes the resonant frequency of the oscillator, a, b, and c are coefficients relevant to the oscillator, and T denotes the temperature of the oscillator.

5. The circuit of claim 3 wherein the processing module is configured to calculate the threshold value using the following equation:

$$m \approx \frac{f_1(n - f_2)}{f_1 - f_2}$$

wherein m denotes the threshold value which is an integer closest to $$\frac{f_1(n - f_2)}{f_1 - f_2},$$

$f_1$ denotes the resonant frequency of the oscillator, $f_2$ denotes the frequency of the oscillating signal when the calibration element is connected to the oscillator, and n denotes the division ratio which is set to a value equal to one of: an integer part of the resonant frequency of the oscillator, and the integer part of the resonant frequency of the oscillator plus 1.

6. The circuit of claim 3, wherein the temperature compensation circuit further includes a power control module coupled to the frequency divider to receive the clock signal and to the oscillator to receive the oscillating signal and configured to connect and disconnect a power supply to and from the temperature sensor, the A/D converter, the calculator and the processing module in response to the clock signal and the oscillating signal.

7. The circuit of claim 6, wherein the temperature compensation circuit further includes a voltage regulator coupled to the power supply and configured to stabilize the voltage provided by the power supply.

8. The circuit of claim 1, wherein the temperature compensation circuit includes:
a temperature sensor configured to measure the temperature of the oscillator and generate an analog temperature value;
an A/D converter coupled to the temperature sensor to receive the analog temperature value and configured to convert the analog temperature value into a digital temperature value;
an address converter coupled to the A/D converter to receive the digital temperature value and configured to convert the digital temperature value into an address;
a frequency divider coupled the oscillator and configured to receive the oscillating signal and to divide the oscillating signal by a division ratio into a clock signal; and
a retrieving module comprising a memory, wherein the retrieving module is coupled to the address converter to receive the address and configured to retrieve the division ratio to be provided to the frequency divider and the threshold value from the address in the memory.

9. The circuit of claim 8, wherein the temperature compensation circuit further includes a power control module coupled to the frequency divider to receive the clock signal and coupled to the oscillator to receive the oscillating signal and configured to connect and disconnect a power supply to and from the temperature sensor, the A/D converter, the address converter and the retrieving module in response to the clock signal and the oscillating signal.

10. The circuit of claim 9, wherein the temperature compensation circuit further includes a voltage regulator coupled to the power supply and configured to stabilize the voltage provided by the power supply.

11. The circuit of claim 1 further comprising a frequency divider coupled to the oscillator and configured to receive the oscillating signal from the oscillator and to generate a clock signal according to a division ratio.

12. The circuit of claim 11, wherein the oscillator comprises a quartz crystal.

13. The circuit of claim 12, wherein the capacitance of the capacitive calibration element is set so that the $|f_1 - f_2| > 1$ Hz, wherein $f_1$ denotes the frequency of the oscillating signal while the calibration element is isolated from the oscillator, and $f_2$ denotes the frequency of the oscillating signal while the calibration element is connected to the oscillator.

14. The circuit of claim 1, further comprising a counter configured to be reset at one of: a rising edge, and a falling edge of the clock signal.

15. A real time clock device, comprising:
an oscillator configured to generate an oscillating signal; and
a circuit, including:
a temperature compensation circuit configured to measure a temperature of the oscillator and to generate a threshold value based on the measured temperature; and
a control system coupled to the oscillator and the temperature compensation circuit and configured to control a connection between a capacitive calibration element and the oscillator based on the threshold value and the oscillating signal of the oscillator.

16. The real time clock device of claim 15, further comprising a calendar, wherein the calendar is coupled to receive the clock signal and configured to display time.

17. The circuit of claim 15, wherein the temperature compensation circuit includes:
a temperature sensor configured to measure the temperature of the oscillator and generate an analog temperature value;
an A/D converter coupled to the temperature sensor to receive the analog temperature value and configured to convert the analog temperature value into a digital temperature value;
a calculator coupled to the A/D converter to receive the digital temperature value and configured to calculate a resonant frequency of the oscillator based on the digital temperature value; and
a processing module coupled to the calculator to receive the resonant frequency of the oscillator and configured to calculate a division ratio to be provided to a frequency divider and the threshold value based on the resonant frequency of the oscillator.

18. A method, comprising:
outputting an oscillating signal from an oscillator;
measuring a temperature of the oscillator;
generating a threshold value based on the temperature of the oscillator; and
controlling connection between a capacitive calibration element and the oscillator based on the threshold value and the oscillating signal of the oscillator.

19. The method of the claim 18, wherein the controlling includes:

generating a count value by counting oscillations in the oscillating signal generated by the oscillator and recounting oscillations in response to the clock signal;

comparing the count value to the threshold value;

connecting the calibration element to the oscillator based on the comparison of the count value to the threshold value; and isolating the calibration element from the oscillator based on the comparison of the count value to the threshold value.

20. The method of claim 18, wherein the generating comprises:

generating an analog temperature value based on the temperature of the oscillator;

converting the analog temperature value into a digital temperature value;

calculating a resonant frequency of the oscillator based on the digital temperature value; and calculating a division ratio and the threshold value based on the resonant frequency of the oscillator.

21. The method of the claim 18, wherein the generating comprises:

generating an analog temperature value based on the temperature of the oscillator;

converting the analog temperature value into a digital temperature value;

converting the digital temperature value into an address; and retrieving a division ratio and the threshold value from the address.

22. The method of claim 18, wherein the calibration element is a capacitive calibration element.

23. The method of claim 22, wherein the capacitance of the capacitive calibration element is set so that the $|f_1-f_2|>1$ Hz, wherein $f_1$ denotes the frequency of the oscillating signal while the calibration element is isolated from the oscillator, $f_2$ denotes the frequency of the oscillating signal while the calibration element is connected to the oscillator.

24. The method of claim 18, wherein the oscillator comprises a quartz crystal.

25. The method of claim 20, wherein calculating the resonant frequency of the oscillator includes:

calculating the temperature of the oscillator using the following equation:

$$T=sk+l$$

wherein T denotes the temperature of the oscillator, s and l are device-dependent coefficients, and k denotes the digital temperature value; and calculating the resonant frequency of the oscillator using the following equation:

$$f_1=aT^2+bT+c$$

wherein $f_1$ denotes the resonant frequency of the oscillator, a, b, and c are coefficients relevant to the oscillator, and T denotes the temperature of the oscillator.

26. The method of claim 20, wherein calculating the threshold value comprises:

calculating the threshold value using the following equation:

$$m \approx \frac{f_1(n-f_2)}{f_1-f_2}$$

wherein m denotes the threshold value which is an integer closest to $$\frac{f_1(n-f_2)}{f_1-f_2},$$

$f_1$ denotes the resonant frequency of the oscillator, $f_2$ denotes the frequency of the oscillating signal when the calibration element is connected to the oscillator, and n denotes the division ratio which is set to a value equal to one of: the integer part of the resonant frequency of the oscillator, and the integer part of the resonant frequency of the oscillator plus 1.

* * * * *

UNITED STATES PATENT AND TRADEMARK OFFICE
CERTIFICATE OF CORRECTION

PATENT NO. : 8,471,619 B2  
APPLICATION NO. : 13/556136  
DATED : June 25, 2013  
INVENTOR(S) : Henry Ge Page 1 of 1

It is certified that error appears in the above-identified patent and that said Letters Patent is hereby corrected as shown below:

On the Title Page Item (30):  
Item (30) was omitted from the face of the patent and should read:  
Foreign Application Priority Data  
December 30, 2009 (CN)...200910206781.9

Signed and Sealed this  
First Day of April, 2014

Michelle K. Lee  
*Deputy Director of the United States Patent and Trademark Office*